US011176717B2

(12) United States Patent
Majeed et al.

(10) Patent No.: US 11,176,717 B2
(45) Date of Patent: Nov. 16, 2021

(54) GUIDING PROTOCOL DEVELOPMENT FOR MAGNETIC RESONANCE THERMOMETRY

(71) Applicants: Siemens Healthcare GmbH, Erlangen (DE); THE UNITED STATES OF AMERICA, AS REPRESENTED BY THE SECRETARY, DEPARTMENT OF HEALTH AND HUMAN SERVICES, Bethesda, MD (US)

(72) Inventors: Waqas Majeed, Ellicott City, MD (US); Sunil Goraksha Patil, Ellicott City, MD (US); Rainer Schneider, Erlangen (DE); Himanshu Bhat, Newton, MA (US); Adrienne Campbell, Bethesda, MD (US)

(73) Assignees: Siemens Healthcare GmbH, Erlangen (DE); The United States of America, as Represented by the Secretary. Department of Health and Human Services, Bethesda, MD (US)

( * ) Notice: Subject to any disclaimer, the term of this patent is extended or adjusted under 35 U.S.C. 154(b) by 21 days.

(21) Appl. No.: 16/583,596

(22) Filed: Sep. 26, 2019

(65) Prior Publication Data

US 2021/0097738 A1 Apr. 1, 2021

(51) Int. Cl.
*G06T 11/00* (2006.01)
*G06T 5/00* (2006.01)
(Continued)

(52) U.S. Cl.
CPC .......... *G06T 11/008* (2013.01); *G06F 3/0482* (2013.01); *G06T 5/002* (2013.01);
(Continued)

(58) Field of Classification Search
USPC .................................................. 382/128, 131
See application file for complete search history.

(56) References Cited

U.S. PATENT DOCUMENTS

| 8,024,025 B2 * | 9/2011 | Mallozzi | G01R 33/4804 600/412 |
| 8,030,922 B2 * | 10/2011 | Roland | G01R 33/4804 324/309 |

(Continued)

OTHER PUBLICATIONS

Chen et al., Quantitative MR thermometry based on phase-drift correction PRF shift method at .35T, 2018, BioMedical Engineering Online, (2018) 17:39 Open Access, pp. 1-15.. (Year: 2018).*

(Continued)

*Primary Examiner* — Ishrat I Sherali

(57) ABSTRACT

A method for decomposing noise into white and spatially correlated components during MR thermometry imaging includes acquiring a series of MR images of an anatomical object and generating a series of temperature difference maps of the anatomical object. The method further includes receiving a selection of a region of interest (ROI) within the temperature difference map and estimating total noise variance values depicting total noise variance in the temperature difference map. Each total noise variance value is determined using a random sampling of a pre-determined number of voxels from the ROI. A white noise component and a spatially correlated noise component of the total noise variance providing a best fit to the total noise variance values for all of the random samplings are identified. The white noise component and the spatially correlated noise component are displayed on a user interface.

9 Claims, 10 Drawing Sheets

(51) Int. Cl.
*G06T 7/00* (2017.01)
*G06F 3/0482* (2013.01)
*G06T 11/20* (2006.01)
*G06T 5/50* (2006.01)

(52) U.S. Cl.
CPC .............. *G06T 5/50* (2013.01); *G06T 7/0016* (2013.01); *G06T 11/203* (2013.01); *G06T 2207/10088* (2013.01); *G06T 2207/20182* (2013.01); *G06T 2207/30016* (2013.01); *G06T 2207/30056* (2013.01); *G06T 2207/30096* (2013.01)

(56) References Cited

U.S. PATENT DOCUMENTS

| | | | | |
|---|---|---|---|---|
| 9,715,726 | B2* | 7/2017 | Patil | G01R 33/56563 |
| 9,851,424 | B2* | 12/2017 | Shirai | A61B 5/055 |
| 10,076,249 | B2* | 9/2018 | Lechner-Greite | A61B 5/015 |
| 10,274,564 | B2* | 4/2019 | Liu | G01R 33/4828 |
| 10,353,034 | B2* | 7/2019 | Bolster, Jr. | G01R 33/5615 |
| 10,677,866 | B1* | 6/2020 | Rinott | A61B 5/015 |
| 2002/0165191 | A1* | 11/2002 | Moonen | A61K 48/00 514/44 R |
| 2008/0033419 | A1* | 2/2008 | Nields | A61B 18/18 606/27 |
| 2009/0238429 | A1* | 9/2009 | Roland | G01R 33/56563 382/131 |
| 2015/0080705 | A1* | 3/2015 | Partanen | A61N 7/02 600/411 |
| 2015/0087963 | A1* | 3/2015 | Tyc | A61B 18/22 600/411 |
| 2015/0160321 | A1* | 6/2015 | Patil | G01R 33/56563 324/309 |
| 2019/0209872 | A1* | 7/2019 | Staruch | A61B 8/5261 |
| 2020/0273175 | A1* | 8/2020 | Drown | G06T 7/0008 |

OTHER PUBLICATIONS

Kortelainen et al., Gradient cumulative filtering to detect MRI thermometry artifacts, 2013, IEEE 978-14799-3163—Jul. 2013, pp. 1-4.. (Year: 2013).*

Denis de Senneville et al., Robust Spatial Phase Unwrapping for On-Line MR-Temperature Monitoring, 2007, IEEE 1-4244-1437—Jul. 2007, pp. 111-137 thru 111-140.. (Year: 2007).*

* cited by examiner

GUIDING PROTOCOL DEVELOPMENT FOR MAGNETIC RESONANCE THERMOMETRY

TECHNICAL FIELD

The present invention relates generally to a group of techniques for guiding protocol development for Magnetic Resonance (MR) Thermometry. The techniques described here may be used in the application and development of MR Thermometry protocols for applications involving, for example, High Intensity Focused Ultrasound (HIFU) and Laser based heating of anatomical tissue.

BACKGROUND

MR temperature imaging (MRTI) has been used to monitor several kinds of thermal therapies including radiofrequency, microwave, laser and MR-guided focused ultrasound (MRgFUS). Thermal therapy procedures have been used to noninvasively treat breast, prostate, liver and brain cancers as well as essential tremor and Parkinson's disease. Proton Resonance Frequency (PRF) thermometry is a widely used Magnetic Resonance Imaging (MRI) based technique to monitor changes in tissue temperature in response to thermal therapy. The use of PRF thermometry with thermal therapy procedures is indispensable to ensure delivery of desired thermal dose to the target tissue, and to minimize unintended damage to the normal tissue.

A PRF thermometry experiment comprises an acquisition of a series of Gradient Recalled Echo (GRE) images. The phase difference between acquisitions is related to the temperature difference by the following expression:

$$\Delta T = \frac{\Delta \phi}{\alpha \gamma B_0 TE} \quad (1)$$

where $\Delta T$, $\Delta \phi$, $\alpha$, $B_0$ and TE correspond to temperature difference, phase difference, off resonance per °C. (in ppm), main magnetic field strength and echo time respectively. Accuracy of PRF thermometry can be characterized by standard deviation of the noise in estimated $\Delta T$ time course in absence of actual temperature change ($\sigma_{\Delta T}$). Noise in estimated $\Delta T$ can be modeled as sum of two independent sources, namely white noise (predominantly thermal noise), and highly spatially correlated noise (predominantly due to drift and motion-related changes in susceptibility):

$$\sigma_{\Delta T}^2 = \sigma_W^2 + \sigma_S^2 \quad (2)$$

where $\sigma_S^2$ and $\sigma_W^2$ represent variance contributions due to white and spatially correlated noise. $\sigma_W$ is related the magnitude signal-to-noise ratio ($SNR_{Mag}$) by the following expression:

$$\sigma_W \propto \frac{1}{TE \cdot SNR_{Mag}} \quad (3)$$

Optimizing a thermometry imaging/post-processing pipeline is challenging due to the following reasons: First, the minimization of $\sigma_S$ and $\sigma_W$ require different strategies. $\sigma_S$ can be reduced by improving background phase removal or applying temporal filtering, whereas $\sigma_W$ can be reduce by optimizing imaging parameters, averaging multiple baseline images before subtraction, or performing spatial or temporal filtering. Therefore, it is critical to estimate these individual contributions to $\Delta T$ noise to develop an effective strategy to minimize $\sigma_{\Delta T}$. The second challenge with optimizing the thermometry imaging/post-processing pipeline is that there are currently no tools on the commercial MRI systems to facilitate imaging parameters for MR thermometry.

SUMMARY

Embodiments of the present invention address and overcome one or more of the above shortcomings and drawbacks, by providing methods, systems, and apparatuses related to guiding protocol development for MR thermometry.

According to some embodiments, a method for decomposing noise into white and spatially correlated components during MR thermometry imaging includes acquiring a series of MR images of an anatomical object and generating a series of temperature difference maps of the anatomical object. The temperature difference map comprises a plurality of voxels depicting temperature values of the anatomical object at a time period. The method further includes receiving a selection of a region of interest (ROI) within the temperature difference map and estimating a plurality of total noise variance values depicting total noise variance in the temperature difference map. Each total noise variance value is determined using a random sampling of a predetermined number of voxels from the ROI. The predetermined number of voxels used for each random sampling is distinct. A white noise component and a spatially correlated noise component of the total noise variance providing a best fit to the total noise variance values for all of the random samplings are identified according to a predetermined relationship between (i) the total noise variance values, (ii) the white noise component and (iii) the spatially correlated component. The white noise component and the spatially correlated noise component are displayed on a user interface.

According to other embodiments, a method for visualizing effects of image parameter modification on total noise in MR thermometry applications includes acquiring a series of MR images of an anatomical object using a first set of imaging parameters and generating a series of temperature difference map of the anatomical object. The temperature difference map comprises a plurality of voxels depicting temperature values of the anatomical object at a time period. A noise map is generated that depicts total noise variance in the temperature difference map on a voxel-by voxel basis. The white noise and spatially correlated components of the total variance in the temperature difference maps are estimated. A user selection of a second set of imaging parameters is received. The second set of imaging parameters includes at least one parameter having a value that is different than a corresponding value in the first set of imaging parameters. A relative change in signal-to-noise value for each voxel is generated based on the first and the second set of imaging parameters. A white noise component of a total noise variance value for each voxel in the temperature difference map is generated using the relative change in signal-to-noise value for the voxel and echo time. A spatially correlated component of a total noise variance value in the temperature difference map is generated using an estimate of spatially correlated component for the first parameter set and TEs of first and second parameter sets. The total noise variance value for each voxel in the temperature difference map are determined using the white noise component for the voxel and an estimate of a spatially correlated component of the total noise variance value for the voxel. An updated noise map that depicts the total noise in the temperature difference map using the total noise variance value for each voxel.

According to other embodiments, a method for automatically determining an optimal imaging parameter set under constraints specified by a user includes receiving a user selection of a plurality of distinct constraints. A plurality of parameter sets is generated that satisfy the constraints. Each parameter set comprises an echo time value. A signal-to-noise value is generated based on each parameter set. A plurality of white noise components of a total noise variance value are generated based on the signal-to-noise values and the echo time value. The white noise components for the parameter sets are evaluated to identify an optimal parameter set.

According to other embodiments, a method for comparing white noise for different imaging parameters MR thermometry imaging applications includes receiving a user selection of a set of parameters comprising an echo time value. A signal-to-noise value is generated based on the set of parameters. A white noise component of a total noise variance value is generated based on the signal-to-noise value and the echo time value. The white noise component is generated on a user interface.

Additional features and advantages of the invention will be made apparent from the following detailed description of illustrative embodiments that proceeds with reference to the accompanying drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing and other aspects of the present invention are best understood from the following detailed description when read in connection with the accompanying drawings. For the purpose of illustrating the invention, there are shown in the drawings embodiments that are presently preferred, it being understood, however, that the invention is not limited to the specific instrumentalities disclosed. Included in the drawings are the following Figures.

DETAILED DESCRIPTION

The present disclosure describes systems and methods for guiding protocol development for MR thermometry. Briefly, three techniques are described herein. First, a method is provided that decomposes $\sigma_{\Delta T}^2$ into its white and spatially correlated components. The second method allows the prediction and visualization of the effect of modification of imaging parameters on $\sigma_{\Delta T}^2$. Third, a method is described that allows comparison of $\sigma_W$ for different choices of imaging parameters. These three techniques may be used alone or in combination to optimize the thermometry imaging pipeline.

Figure 1:
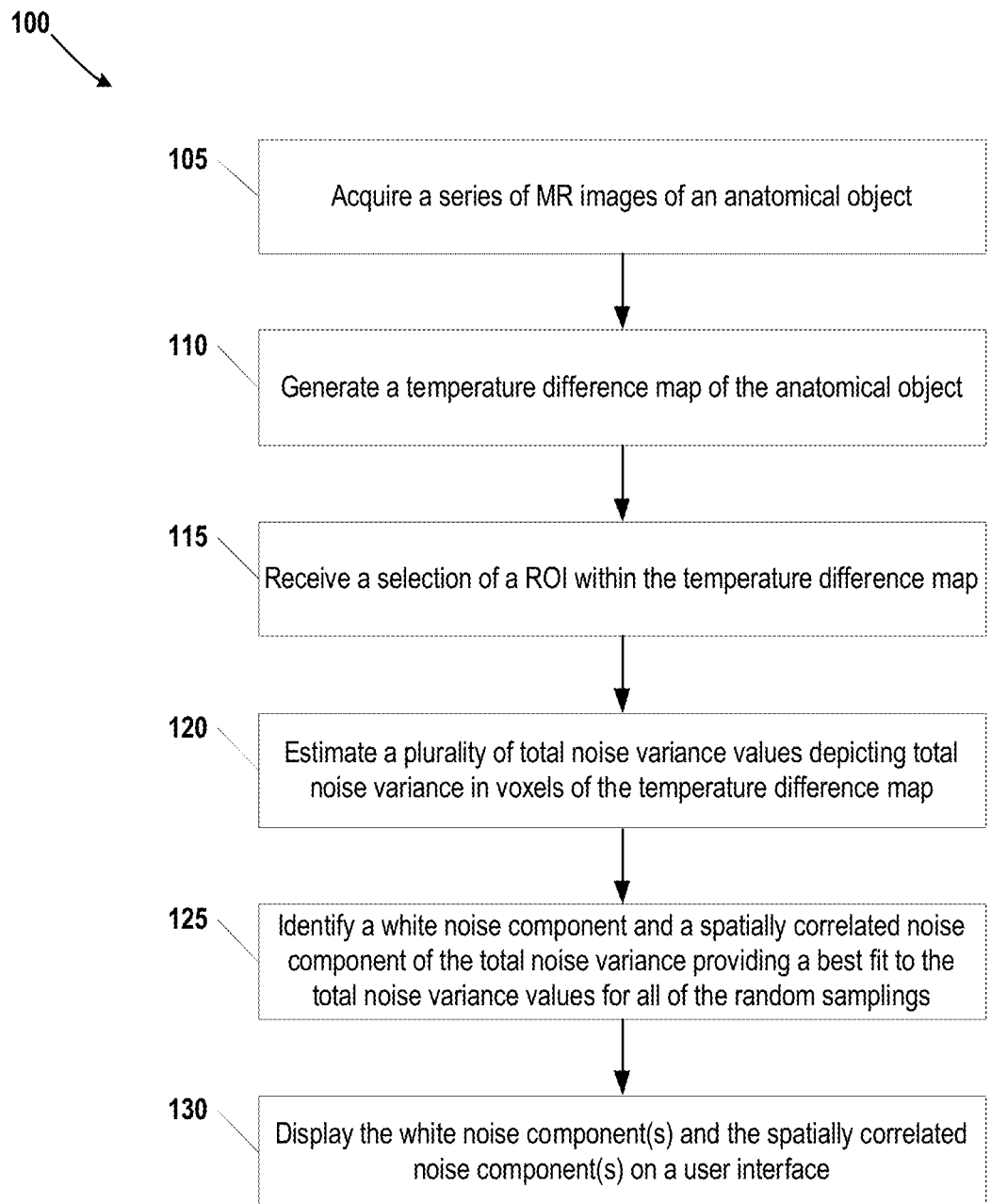
FIG. 1 illustrates a method for decomposing noise acquired during MR thermometry imaging into white and spatially correlated components, according to some embodiments.

FIG. 1 illustrates a method 100 for decomposing noise acquired during MR thermometry imaging into white and spatially correlated components, according to some embodiments. Briefly, the computing system executing the method displays estimated white ($\sigma_W^2$) and spatially correlated ($\sigma_S^2$) components of the total variance. This decomposition provides insights into the root cause of the undesirably high variance, and helps the user narrow down the options to address the issue.

Starting at step 105, a series of MR images of an anatomical object are acquired by the MRI scanner. Techniques for acquiring MR images are generally known in the art and, thus, these techniques are not described in detail herein. A brief overview of MR acquisition is provided below with the description of FIG. 10. Next, at step 110, a series of temperature difference maps of the anatomical object is generated using the MR image data acquired at step 105. In thermometry applications, a set of baseline data is first acquired before any heating of the tissue in the anatomical object. Subsequent temperature measurements are then made with respect to the baseline. For example, the data acquired at step 105 may comprise MR phase images; alternatively, the acquired data may be used compute the phase images. A temperature-difference map may then be generated by subtracting, on a voxel-by-voxel basis, the baseline's phase image from later acquired phase image corresponding to a subsequently obtained MR image. The phase differences may then be converted into temperature differences based on the PRF temperature dependence (as is generally known in the art).

Once the temperature maps are generated, it is presented to a user in a user interface (e.g., display of the MR scanner) at step 115. Then, at step 120 the computing system executing the method receives a selection of a region of interest (ROI) within the temperature difference map. In some embodiments, the ROI is selected by a user interacting with a user interface displaying the temperature difference map. For example, in one embodiment, the ROI is selected by the user drawing the ROI on the user interface in an area with no true temperature change. During protocol optimization, a series may be acquired without external heating. In other embodiments, the ROI is automatically identified based on a user identification of an anatomical object of interest. For example, the user may click on the object and one or more object segmentation techniques generally known in the art may be applied to identify the voxels that comprise the object; these voxels can then be used to designate the ROI.

In still other embodiments, the computer may automatically identify and segment the object based on the study being performed. For example, the user may specify that a brain study is being performed. The computer may then automatically identify the brain the image (e.g., using a trained machine learning model), and then perform the segmentation to generate the ROI.

Next at steps 120-125 the white ($\sigma_W^2$) and spatially correlated ($\sigma_S^2$) components of the total variance are estimated using an average of multiple random samplings of voxels in the ROI. Averaging $\Delta T$ across N voxels reduces $\sigma_W^2$ by 1/N but has negligible impact on $\sigma_S^2$:

$$\sigma_{\Delta T}^{2^N} \approx \frac{\sigma_W^2}{N} + \sigma_S^2 \quad (4)$$

where $\sigma_{\Delta T}^{2^N}$ represents the variance of the $\Delta T$ time-course from N voxels. Starting with step 120, $\sigma_{\Delta T}^{2^N}$ is estimated for different values of N by randomly choosing N unique voxels from the ROI specified by the user. A "sampling with replacement" approach is used in some embodiments to improve the estimates. With this approach, voxels may be selected for multiple random samplings of the ROI (as opposed to only allowing a particular voxel to be used in a single sampling). Then, at step 125, predetermined relationship specified Equation 4 is fitted between N and $\sigma_{\Delta T}^{2^N}$ to estimate $\sigma_W^2$ and $\sigma_S^2$. The values providing the best fit are then used as the final values for $\sigma_W^2$ and $\sigma_S^2$.

Finally at step 130, the final values for $\sigma_W^2$ and $\sigma_S^2$ may be presented in the user interface. For example, in one embodiment, a $\sigma_{\Delta T}$ map overlaid with the ROI is presented adjacent to text indicating the final values for $\sigma_W^2$ and $\sigma_S^2$ for that particular ROI.

Figure 2:
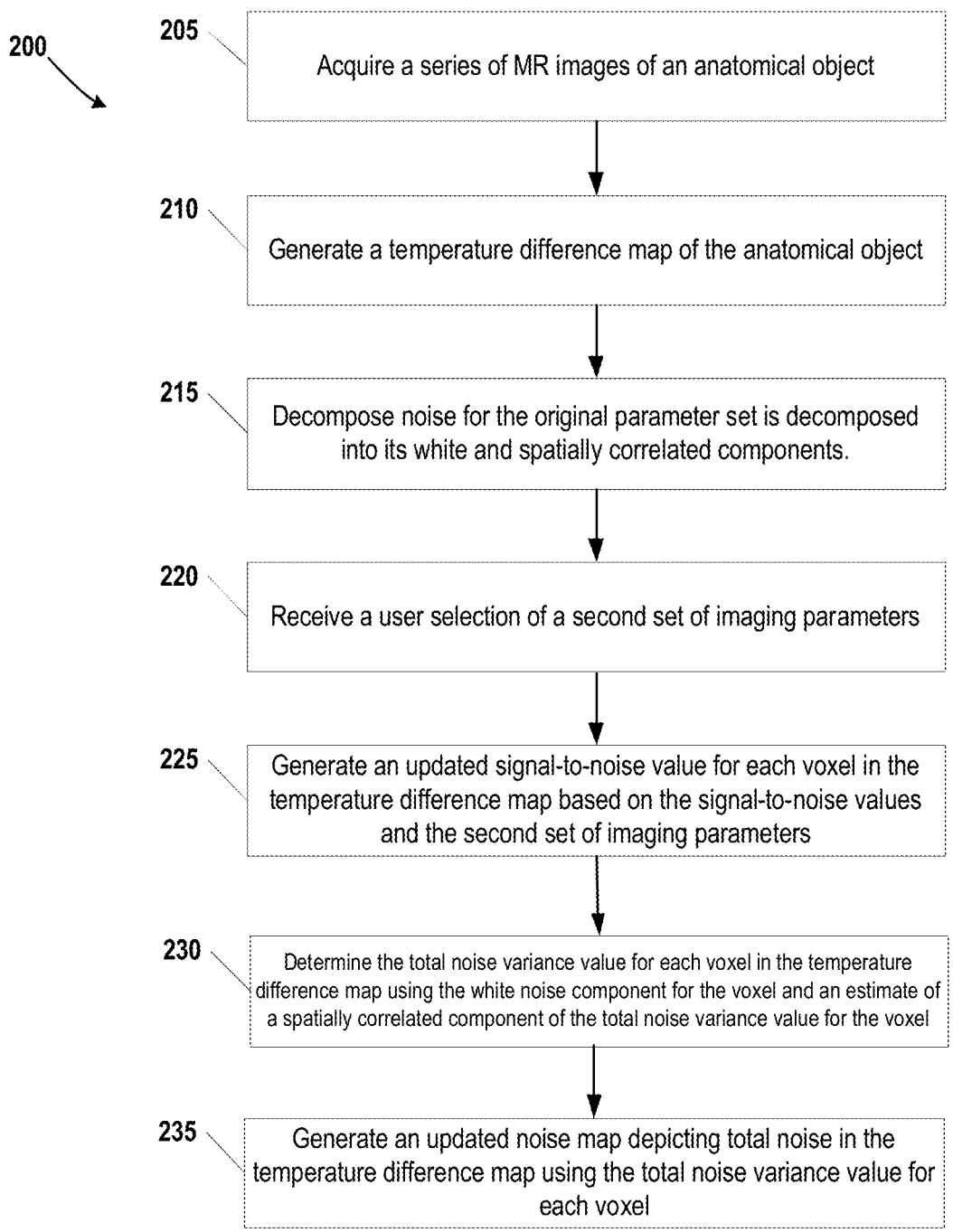
FIG. 2 illustrates a method for visualizing effects of image parameter modification on total noise in MR thermometry, according to some embodiments.

FIG. 2 illustrates a method 200 for visualizing effects of image parameter modification on total noise in MR thermometry applications. Briefly, the user provides a new set of acquisition parameters, and the computer displays predicted $\sigma_{\Delta T}$ maps for that parameter set. This method 200 can be used to visualize the effect of various sets of imaging parameters on $\sigma_{\Delta T}$ without repeating the experiment. Starting at steps 205-210, an MRI system is used to acquire MR images of an anatomical object with a first set of imaging parameters and a series of temperature images of the anatomical object is created illustrating $\sigma_{\Delta T}$ on a voxel-by-voxel basis.

Continuing with reference to FIG. 2, at step 215, $\sigma_{\Delta T}^2$ for the original parameter set is decomposed into its white and spatially correlated components. For example, in one embodiment, the user estimates $\sigma_S^2$ in the area of interest using the method 100 described in FIG. 1, in case spatially correlated noise has a significant contribution. Alternatively, $\sigma_S^2$ can be assumed to be zero.

Next, at step 220, the computer receives a user selection of a second set of imaging parameters (e.g., via user interaction with a user interface). The second set of imaging parameters includes at least one parameter having a value that is different than a corresponding value in the first set of imaging parameters; In addition, the user provides T1 and T2* values for the target tissue. For example, the user may one of the following: 1) T1 and T2* maps, 2) Typical T1 and T2* values for the tissue of interest. Then, at step 225, the computer system generates relative change in signal-to-noise value for each voxel using both sets of imaging parameters, T1 and T2* along with fundamental MRI signal/noise equations generally known in the art. For example, the following equation defines signal-to-noise in terms of voxel volume, number of measurements, and receiver bandwidth:

$$SNR = K(\text{voxel volume}) \sqrt{\frac{\text{Number of Measurements}}{\text{Bandwidth}}} \quad (5)$$

The constant K includes factors dependent on the MRI system hardware (e.g., coil, pre-amp and noise power spectrum), pulse sequence parameters (e.g., TR, TE), and tissue-dependent factors (e.g., T1, T2*).

Continuing with reference to FIG. 2, at step 230, the computer determines the total noise variance value for each voxel in the temperature difference map using a white noise component for the voxel and an estimate of a spatially correlated component of the total noise variance value for the voxel. For example, in one embodiment, Equation 3 is utilized along with relative change in SNR (estimated in as described above) and first/second TE values to estimate relative changes in $\sigma_W^2$, which are then used to predict $\sigma_{\Delta T}$ using Equation 2, by either using $\sigma_S^2$ estimated for the original parameters, or assuming $\sigma_S^2 = 0$. Then, at step 235, the computer generates an updated noise map depicting total noise in the temperature difference map using the total noise variance value for each voxel.

Figure 3:
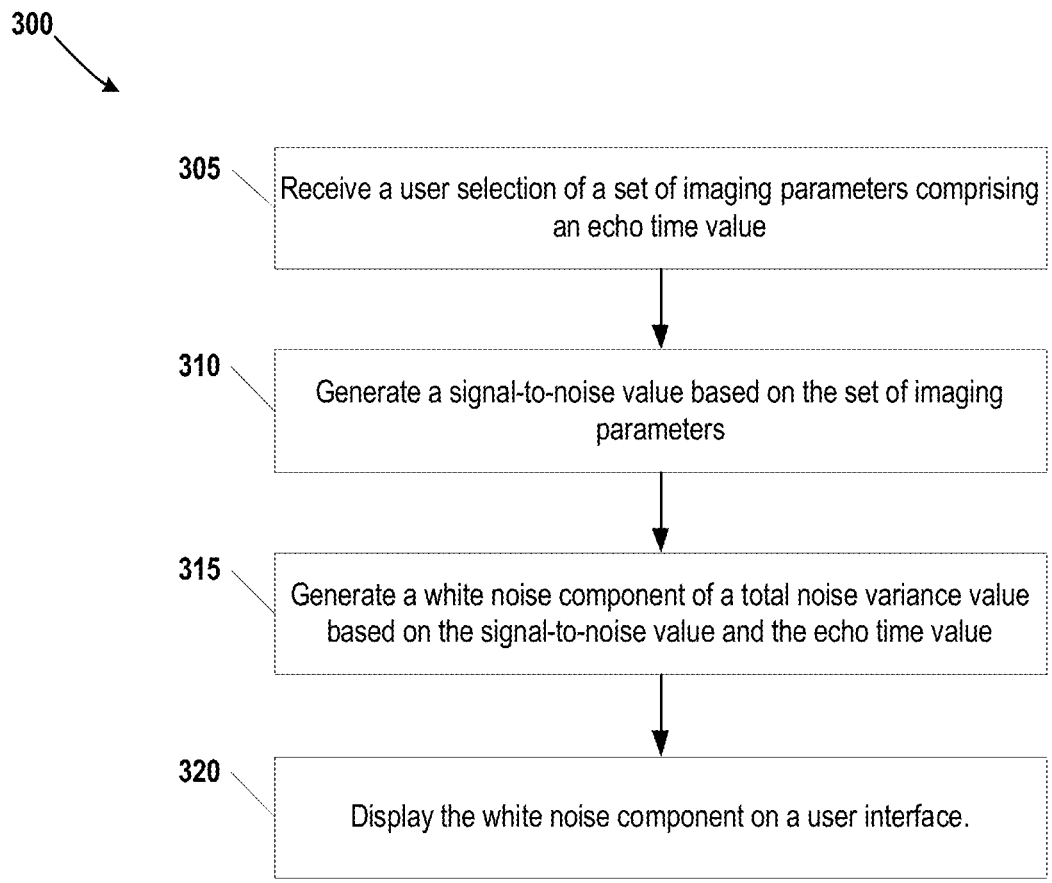
FIG. 3 shows an example method for comparing white noise for different imaging parameters MR thermometry imaging applications, according to some embodiments.
Figure 4:
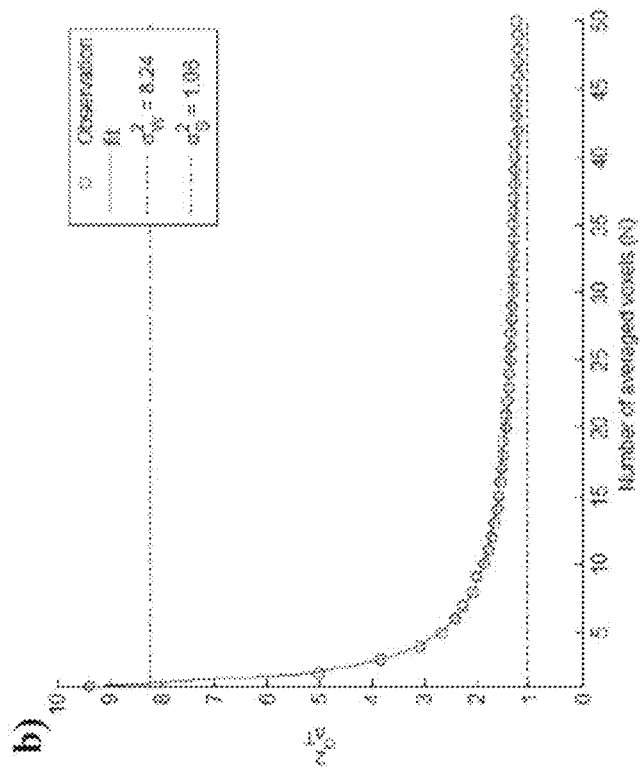
FIG. 4 shows an example $\sigma_{\Delta T}$ map computed using a given processing pipeline from cardiac thermometry data acquired from a human subject, and accompanying noise predictions made with the techniques described herein.
Figure 4:
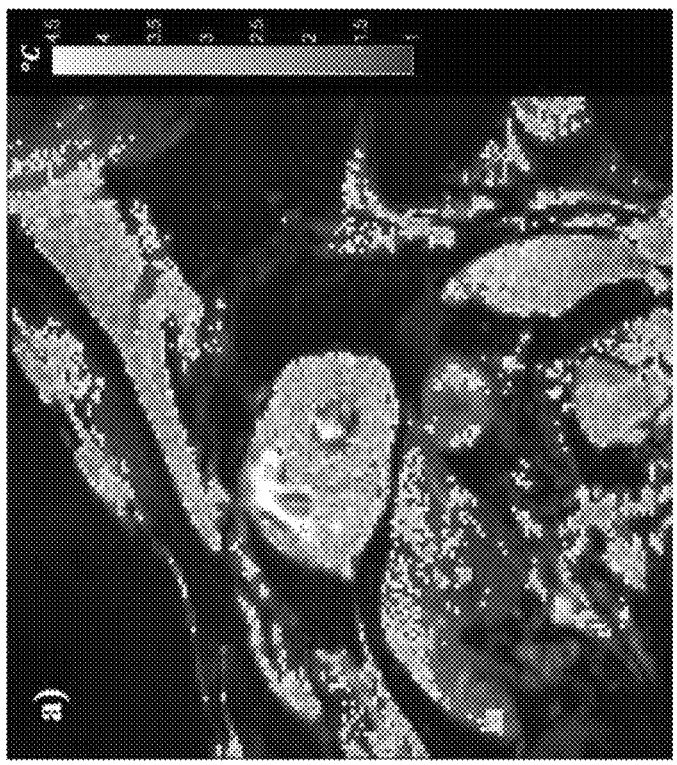
Figure 5:
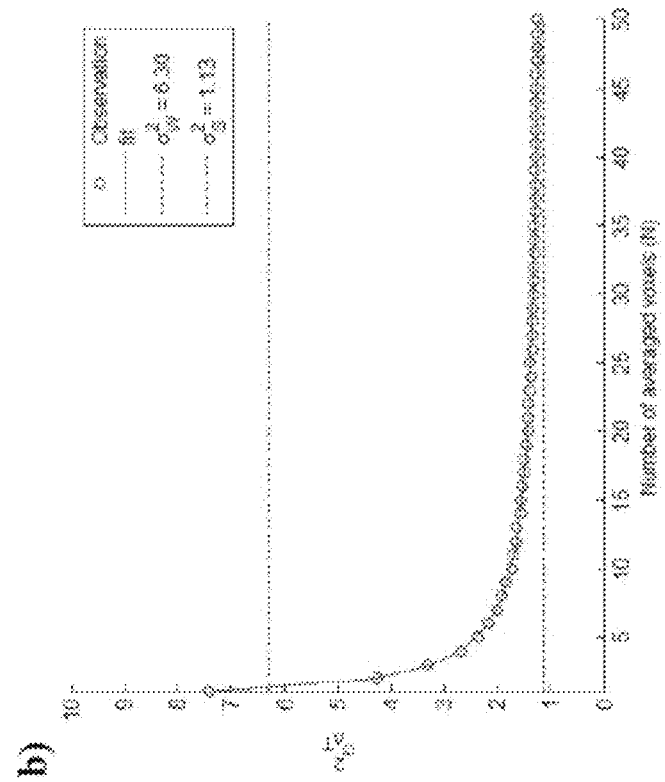
FIG. 5 shows an example $\sigma_{\Delta T}$ map, and accompanying noise predictions made with the techniques described herein illustrating the effect of averaging baseline images.

FIG. 3 shows an example method 300 for comparing white noise for different imaging parameters MR thermometry imaging applications, according to some embodiments. Starting at step 305, the computer implementing the method 300, receives a user selection of a set of imaging parameters comprising an echo time value. Additionally, T1 and T2* of the target tissue type are provided by the user. Various techniques may be used for supplying T1 and T2*. For example, in one embodiment, the user selects a target tissue type from a drop-down menu. and corresponding T1 and T2* are automatically retrieved from a database. Alternatively, T1 and T2* values of the target tissue type can be directly supplied by the user.

Continuing with reference to FIG. 3, at step 310, the computer generates a signal-to-noise value based on the set of imaging parameters (e.g., using Equation 5). Next, at step 315, the computer generates a white noise component of a total noise variance value based on the signal-to-noise value and the echo time value using Equation 3. Then, at step 320, the computer displays the white noise component on a user interface. In some embodiments, the method 300 may be performed iteratively. After each modification of the imaging parameters, the feature computes relative change in the white noise component as described above.

The general concept illustrated in FIG. 3 can be extended to automatically determine the optimal parameter set under given constraints by comparing white noise variance values for different parameter sets that satisfy the constraints. For example, in some embodiments, the user provides a plurality of constraints such as spatial and temporal resolution. Then a plurality of imaging parameter sets satisfying the constraints can be generated, and a white noise component of a total noise variance value of each parameter set can be computed. The parameter set satisfying the constraint with the minimum white noise component can be presented to the user as the optimal parameter set satisfying the constraints.

FIGS. 4-9 illustrate example applications of the techniques described above. The left hand side of FIG. 4 (labeled "a") shows a $\sigma_{\Delta T}$ map computed using a given processing pipeline from cardiac thermometry data acquired from a human subject. The plot shown in the right hand side (labeled "b") shows a plot was obtained by applying the method 100 shown in FIG. 1 on an ROI drawn on the myocardium.

The estimated values of $\sigma_W^2$ and $\sigma_S^2$ suggest that $\sigma_{\Delta T}^2$ is dominated by white noise. This result guides the user to focus on reducing $\sigma_W^2$ by optimizing the imaging protocol and applying spatial/temporal filtering or using averaged baseline images. To test this prediction of the method 100 two different modifications to the original processing pipeline as described below.

The same data were processed by modifying the processing pipeline in the following way: Average of two baseline images was used prior for phase subtraction, instead of using a single average. This should reduce $\sigma_W^2$ but not $\sigma_S^2$. The resultant $\sigma_{\Delta T}$ map is shown in left hand side (labeled "a") of FIG. 5. A clear overall reduction in $\sigma_{\Delta T}$ is observed, compared with the $\sigma_{\Delta T}$ map shown in FIG. 4. The left hand side of FIG. 5 (labeled "b") shows the result of applying the method 100 of FIG. 4 on the resultant $\Delta T$ time series. As expected, major (~24%) improvement is seen in $\sigma_W^2$, whereas a relatively minor change is observed in $\sigma_S^2$.

Figure 6:
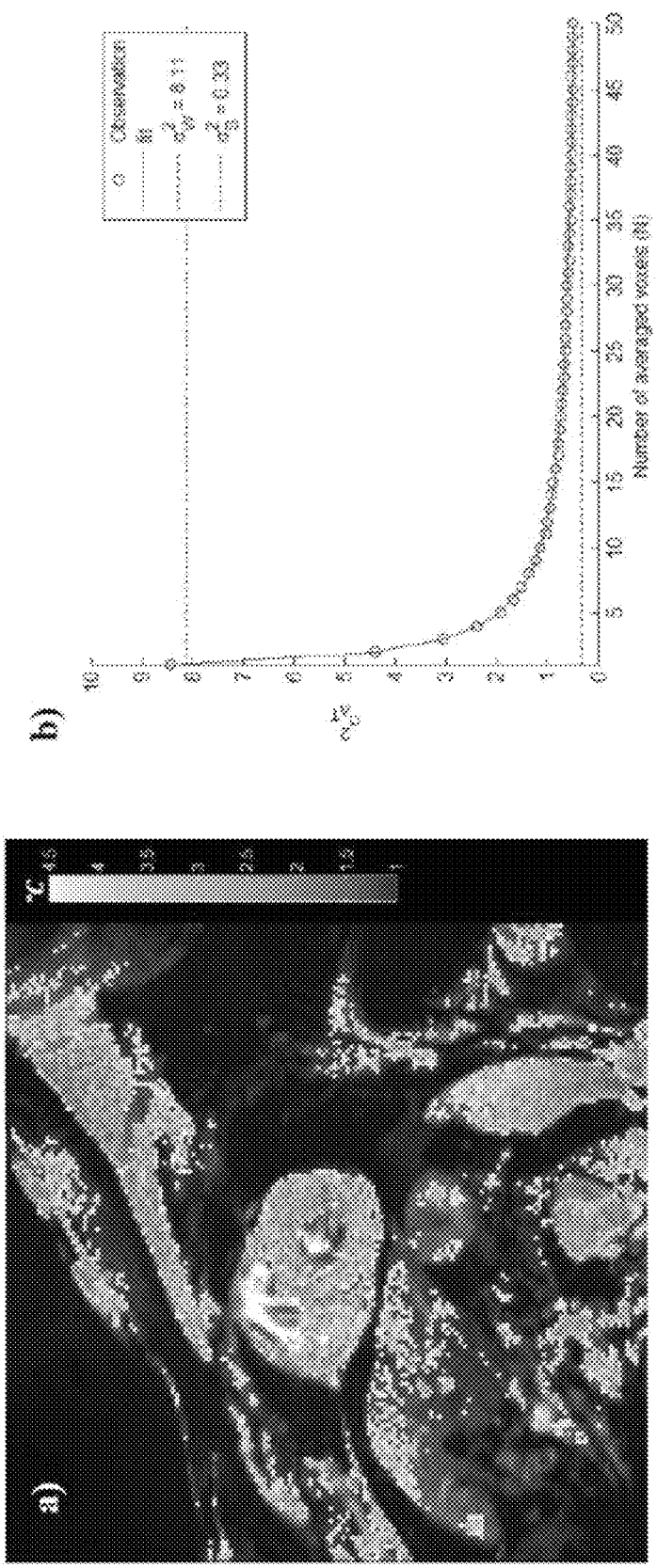
FIG. 6 shows an example $\sigma_{\Delta T}$ map, and accompanying noise predictions made with the techniques described herein illustrating the effect of removing background DC phase.

To evaluate the effect of removing DC phones, the same data were processed by modifying the original processing pipeline (used for FIG. 4) in the following way: Average $\Delta T$ in the myocardium was subtracted from all voxels on an image-by-image basis. This should reduce $\sigma_S^2$ but not $\sigma_W^2$. The resultant $\sigma_{\Delta T}$ map is shown in left hand side of FIG. 6. Consistent with the prediction of method 100 (shown in FIG. 4), the improvement over the original pipeline is relatively minor. The right hand side of FIG. 6 shows the result of applying the method 100 on the resultant $\Delta T$ image series. As predicted, significant reduction in $\sigma_S^2$ is observed, whereas $\sigma_W^2$ remains unaffected compared with the plot shown in FIG. 4.

Figure 7:
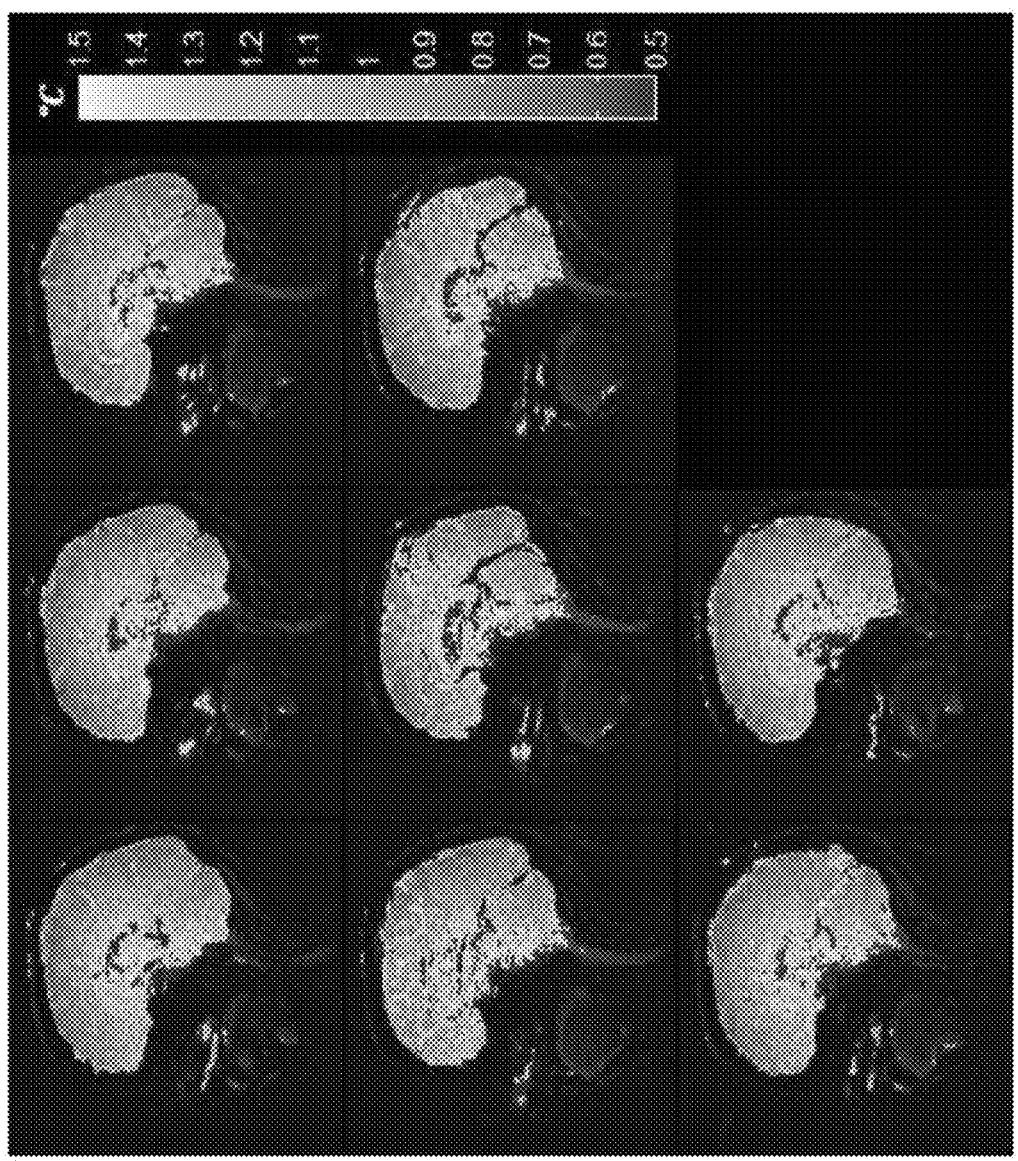
FIG. 7 shows an example $\sigma_{\Delta T}$ computed from a brain thermometry acquisition (TE=TE0) in absence of any heating.

FIG. 7 shows $\sigma_{\Delta T}$ computed from a brain thermometry acquisition (TE=TE0) in absence of any heating. $\sigma_S^2$ was computed using the method 100 shown in FIG. 1 and found to be negligible compared with $\sigma_W^2$.

Figure 8:
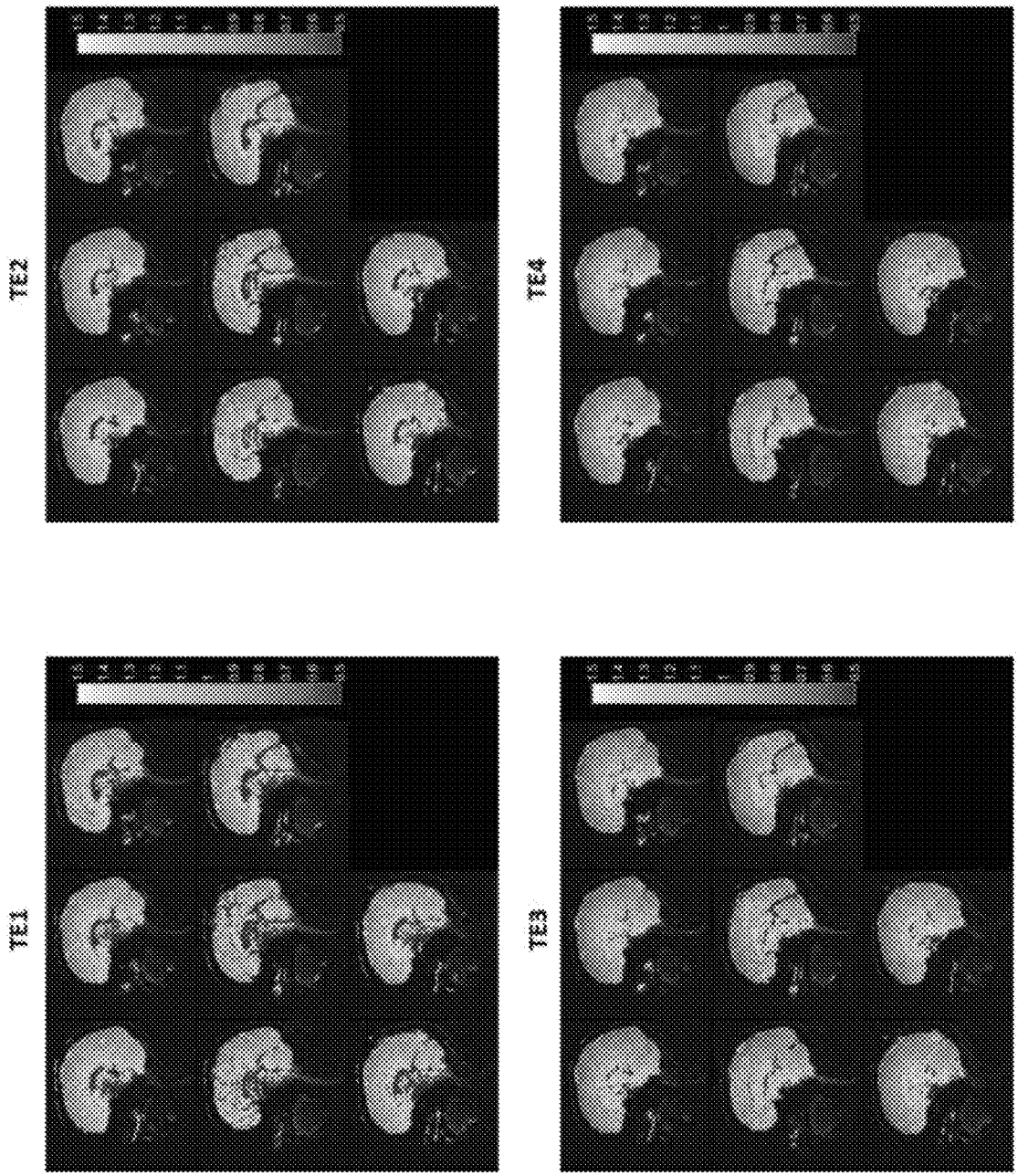
FIG. 8 shows simulated $\sigma_{\Delta T}$ maps for multiple TEs.
Figure 9:
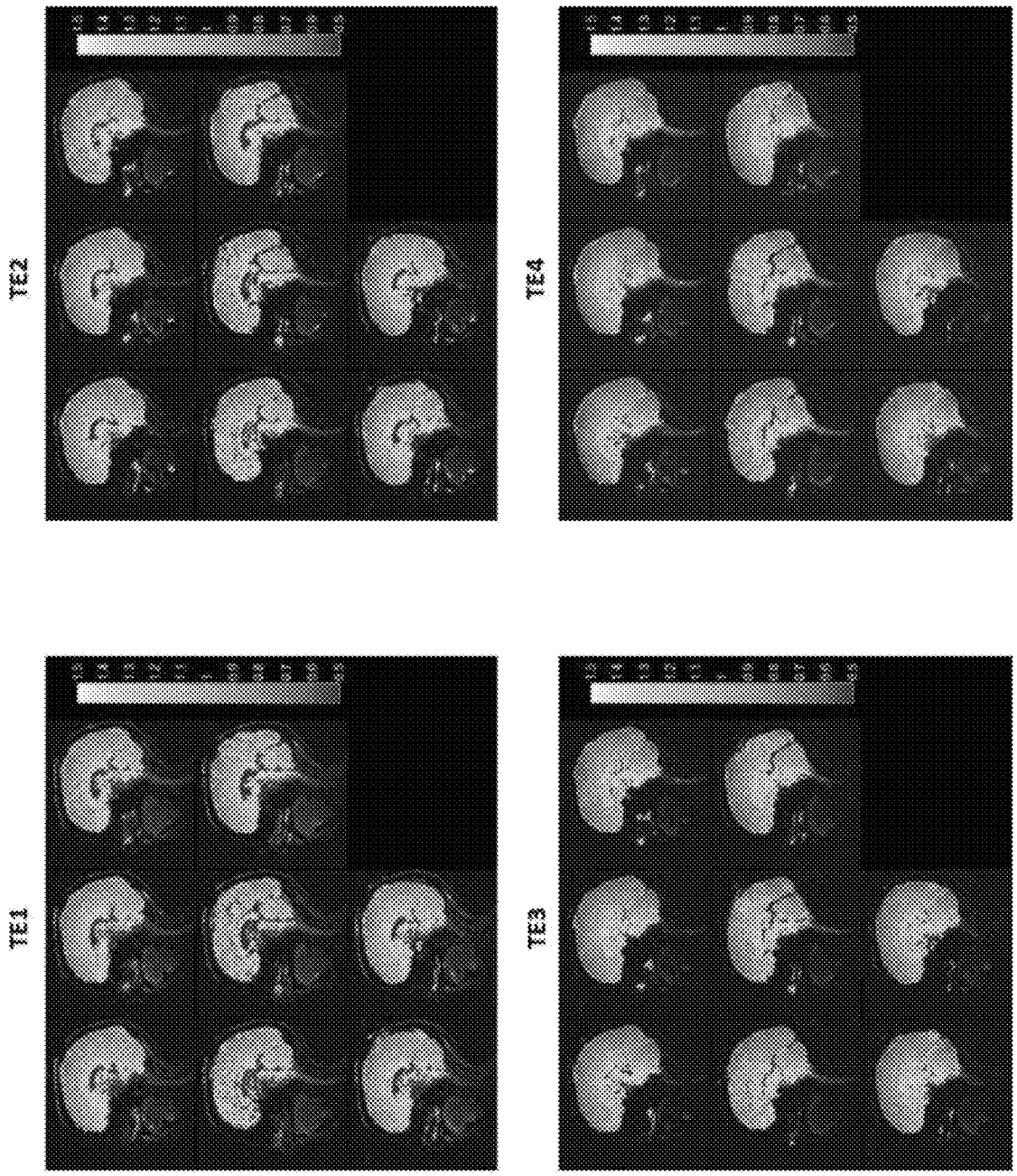
FIG. 9 shows $\sigma_{\Delta T}$ maps for multiple TEs generated using collected data to confirm the validity of the simulated $\sigma_{\Delta T}$ maps shown in FIG. 8.

The method 300 described above in FIG. 3 was used to simulate $\sigma_{\Delta T}$ maps for multiple TEs as shown in FIG. 8. To validate these predictions, data was for the same TEs and computed corresponding $\sigma_{\Delta T}$ maps as shown in FIG. 9. Excellent agreement between the predicted and measured $\sigma_{\Delta T}$ maps is observed, confirming the validity of the method 300 as a tool to visualize the effect of protocol changes on $\sigma_{\Delta T}$.

Figure 10:
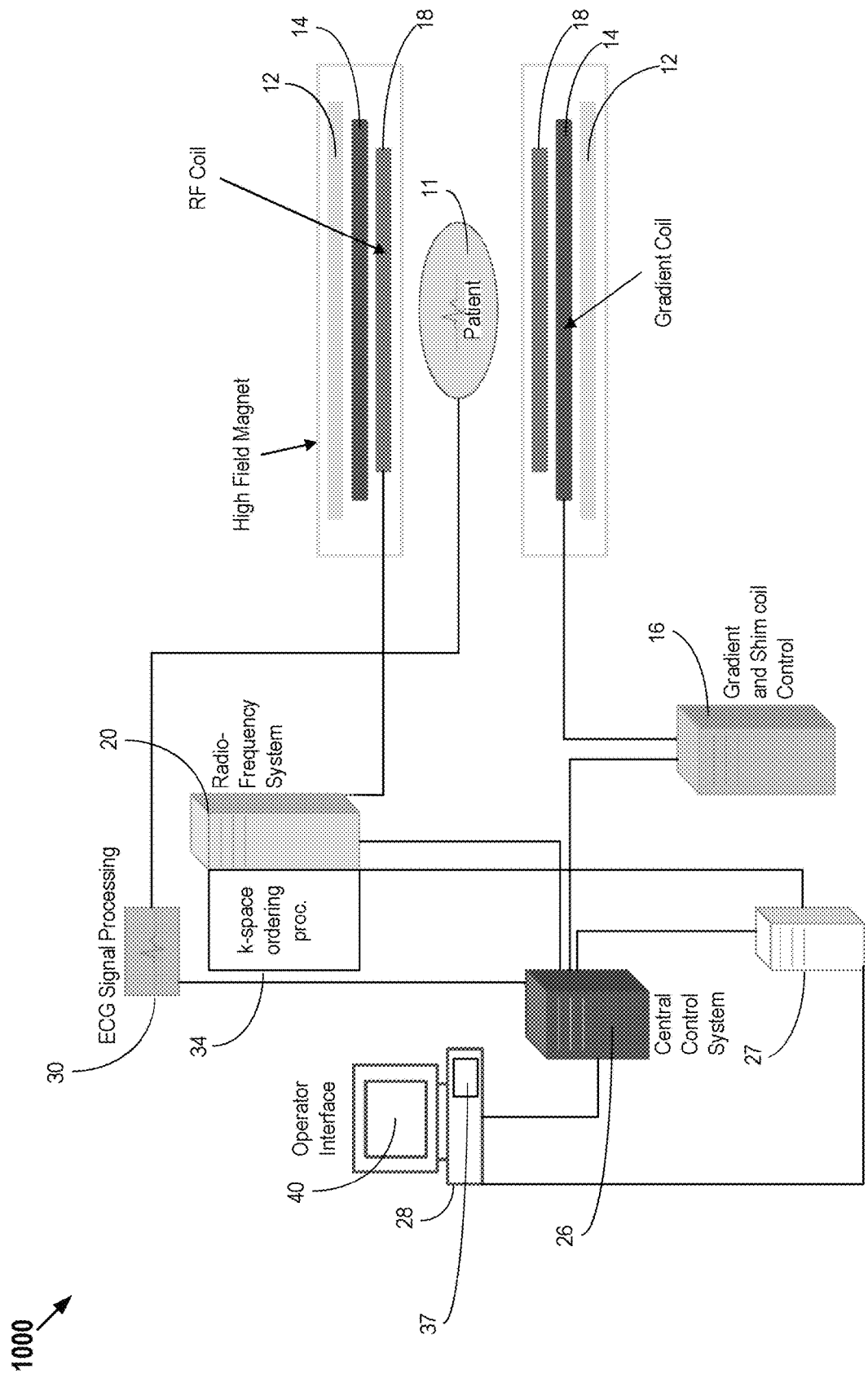
FIG. 10 shows an example MRI system that may be used in acquisition of the reference and dynamic images, according to some embodiments of the present invention.

FIG. 10 shows an example MRI system 1000 that may be used in acquisition of the reference and dynamic images, according to some embodiments of the present invention. In system 1000, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control computer 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image. In some embodiments, the image data processor is located in central control computer 26. However, in other embodiments such as the one depicted in FIG. 11, the image data processor is located in a separate unit 27. Electrocardiogram (ECG) synchronization signal generator 30 provides ECG signals used for pulse sequence and imaging synchronization. A two or three dimensional k-space storage array of individual data elements in k-space component processor unit 34 stores corresponding individual frequency components which comprises an MR dataset. The k-space array of individual data elements has a designated center and individual data elements individually have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control computer 26 uses information stored in an internal database to process the detected MR signals in a coordinated manner to generate high quality images of a selected slice(s) of the body (e.g., using the image data processor) and adjusts other parameters of system 1000. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control computer 26 and enables user modification of magnetic resonance imaging signals in substantially real time. Display processor 37 processes the magnetic resonance signals to provide image representative data for display on display 40, for example.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

The term "computer readable medium" as used herein refers to any medium that participates in providing instructions to the processor for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk or removable media drive. One non-limiting example of volatile media is dynamic memory. Non-limiting examples of transmission media include coaxial cables, copper wire, and fiber optics, including the wires that make up one or more buses. Transmission media may also take the form of acoustic or light waves, such as those generated during radio wave and infrared data communications.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

As used herein, the term "user interface" means any device for rendering information to a user and/or requesting information from the user. A user interface includes at least one of textual, graphical, audio, video, animation, and/or haptic elements. A textual element can be provided, for example, by a monitor, display, projector, etc. A graphical element can be provided, for example, via a monitor, display, projector, and/or visual indication device, such as a light, flag, beacon, etc. An audio element can be provided, for example, via a speaker, microphone, and/or other sound generating and/or receiving device. A video element or animation element can be provided, for example, via a monitor, display, projector, and/or other visual device. A haptic element can be provided, for example, via a very low frequency speaker, vibrator, tactile stimulator, tactile pad, simulator, keyboard, keypad, mouse, trackball, joystick, gamepad, wheel, touchpad, touch panel, pointing device, and/or other haptic device, etc.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112(f), unless the element is expressly recited using the phrase "means for."

The invention claimed is:

1. A method for decomposing noise into white and spatially correlated components during MR thermometry imaging, the method comprising:
    acquiring a series of MR images of an anatomical object;
    generating a series of temperature difference maps of the anatomical object, wherein the temperature difference map comprises a plurality of voxels depicting temperature values of the anatomical object at a time period;
    receiving a selection of a region of interest (ROI) within the temperature difference map;
    estimating a plurality of total noise variance values depicting total noise variance in the temperature difference map, wherein (i) each total noise variance value is determined using a random sampling of a pre-determined number of voxels from the ROI and (ii) the pre-determined number of voxels used for each random sampling are distinct;
    identifying a white noise component and a spatially correlated noise component of the total noise variance providing a best fit to the total noise variance values for all of the random samplings according to a predetermined relationship between (i) the total noise variance values, (ii) the white noise component and (iii) the spatially correlated component; and
    displaying the white noise component and the spatially correlated noise component on a user interface.

2. The method of claim 1, wherein the ROI is selected by a user interacting with a user interface displaying the temperature difference map.

3. The method of claim 2, wherein the ROI is selected by the user drawing the ROI on the user interface.

4. The method of claim 1, wherein the ROI is automatically identified based on a user identification of an anatomical object of interest.

5. The method of claim 1, wherein the series of MR images of the anatomical object are acquired using a first set of parameters comprising an echo time parameter, and the method further comprises:
    receiving a user selection of a second set of parameters, wherein the second set of parameters includes at least one parameter having a value that is different than a corresponding value in the first set of parameters;

generating an updated signal-to-noise value for each voxel in the temperature difference map based on the signal-to-noise values and the second set of parameters;

generating an updated white noise component of an updated total noise value for each voxel in the temperature difference map using the updated signal-to-noise value for the voxel and an updated echo time;

displaying the updated white noise components on the user interface.

6. The method of claim 5, wherein the first set of parameters and the second set of parameters each comprise T1 and T2* values for the anatomical object.

7. The method of claim 6, further comprising:

receiving a user selection of a tissue type associated with the anatomical object; and determining the T1 and T2* values for the anatomical object based on the tissue type.

8. The method of claim 7, wherein the user selection is received via a drop-down menu in the user interface.

9. The method of claim 6, wherein the T1 and T2* values for the anatomical object are input by a user into the user interface.

\* \* \* \* \*